United States Patent
Chilcote et al.

(10) Patent No.: US 10,983,178 B2
(45) Date of Patent: Apr. 20, 2021

(54) ACTIVE SENSOR CIRCUITRY

(71) Applicant: Honeywell International Inc., Morris Plains, NJ (US)

(72) Inventors: Jason M. Chilcote, Frisco, TX (US); Fred Hintz, Freeport, IL (US)

(73) Assignee: Honeywell International Inc., Morris Plains, NJ (US)

( * ) Notice: Subject to any disclaimer, the term of this patent is extended or adjusted under 35 U.S.C. 154(b) by 60 days.

(21) Appl. No.: 16/415,296

(22) Filed: May 17, 2019

(65) Prior Publication Data
US 2020/0363482 A1 Nov. 19, 2020

(51) Int. Cl.
*G01R 33/00* (2006.01)
*G01R 33/07* (2006.01)
*G01R 33/09* (2006.01)
*G01R 7/04* (2006.01)
*H02M 7/04* (2006.01)

(52) U.S. Cl.
CPC ......... *G01R 33/0041* (2013.01); *G01R 33/07* (2013.01); *G01R 33/096* (2013.01); *H02M 7/04* (2013.01)

(58) Field of Classification Search
None
See application file for complete search history.

(56) References Cited

U.S. PATENT DOCUMENTS

| 9,134,385 | B2 | 9/2015 | Chilcote et al. | |
|---|---|---|---|---|
| 2010/0052665 | A1* | 3/2010 | Van Den Homberg | G01R 33/093 324/228 |
| 2012/0068692 | A1* | 3/2012 | Patel | G01R 15/202 324/202 |
| 2013/0271125 | A1* | 10/2013 | Deak | G01R 31/50 324/252 |
| 2019/0214856 | A1* | 7/2019 | Brown | H02J 50/80 |

FOREIGN PATENT DOCUMENTS

WO 2018/025218 A1 2/2018

OTHER PUBLICATIONS

How to Replace a 2-Wire Reed Switch With a 3-Wire Sensor, 2018, [online article], [retrieved from the Internet Sep. 12, 2019], <https://cotorelay.com › 2018/05 › 2WireApplication-AppNote-short> 1 page.

* cited by examiner

*Primary Examiner* — Jermele M Hollington
(74) *Attorney, Agent, or Firm* — Alston & Bird LLP

(57) ABSTRACT

Apparatuses and sensor systems are described with magnetoresistive sensor configurations. An example magnetoresistive sensor configuration includes an input feed that receives an electrical current, magnetic field detection circuitry in electrical communication with the input feed, and a feedback connection in electrical communication with the magnetic field detection circuitry and the input feed. The magnetic field detection circuitry transitions between a released state and an operated state in response to an external magnetic source. The configuration further includes an electrical storage element in electrical communication with the input feed that maintains a minimum operating voltage and current within the magnetoresistive sensor in an instance in which the magnetic field detection circuitry is operated.

16 Claims, 9 Drawing Sheets

ACTIVE SENSOR CIRCUITRY

TECHNOLOGICAL FIELD

Example embodiments of the present invention relate generally to sensor systems and, more particularly, to magnetoresistive sensor configurations.

BACKGROUND

Sensor systems may employ switches, contacts, and other applicable devices that are operable in response to applied magnetic fields. These devices may be used in industrial applications, medical devices, consumer electronics, and white goods to function as proximity sensors, speed sensors, position sensors, and the like. Applicant has identified a number of deficiencies and problems associated with conventional sensor devices and associated circuitry configurations. Through applied effort, ingenuity, and innovation, many of these identified problems have been solved by developing solutions that are included in embodiments of the present disclosure, many examples of which are described in detail herein.

BRIEF SUMMARY

Apparatuses and sensor systems are described with magnetoresistive sensor configurations. An example magnetoresistive sensor configuration may include an input feed configured to receive an electrical current, magnetic field detection circuitry in electrical communication with the input feed, and a feedback connection in electrical communication with the magnetic field detection circuitry and the input feed. The magnetic field detection circuitry may be configured to, in the presence of an external magnetic source, provide a periodically alternating high and low logic low level, and, in the absence of an external magnetic source, provide a constant logic high level (or high impedance state). The system and sensor may also be configured with the opposite magnetic logic polarity. The configuration may further include an electrical storage element in electrical communication with the input feed. During the periodic instances in which the magnetic field detection circuitry is in the logic high level indicating the absence of an external magnetic source, the magnetoresistive sensor configuration may be configured to direct at least a portion of the electrical current received via the input feed to the electrical storage element so as to store electrical energy in the electrical storage element. During the periodic instances in which the magnetic field detection circuitry is in the logic low level (or low impedance state) indicating the presence of an external magnetic source, the magnetic field detection circuitry may be configured to drive the periodically alternating output, and the electrical storage element may be configured to maintain a minimum operating voltage and current within the magnetoresistive sensor.

In some embodiments, the magnetic field detection circuitry may also include an anisotropic magneto-resistive (AMR) bridge or hall sensor configured to identify the presence of the external magnetic source. In such an embodiment, the magnetic field detection circuitry may further include a dual threshold comparator configured to receive a voltage output from the AMR bridge or hall sensor and compare the voltage output with one or more voltage thresholds.

In some embodiments, the magnetic field detection circuitry may also include output flip flop circuitry and logic circuitry configured to generate an alternating current (AC) voltage output. In such an embodiment, the configuration may also include an alternating current (AC) waveform detector integrated circuit configured to generate a direct current (DC) voltage output from the AC voltage output.

In some cases, the magnetic field detection circuitry may also include clock counter decoder circuitry configured to periodically direct electrical signals to the magnetic field detection circuitry.

In some other embodiments, the configuration may further include isolation circuitry configured to isolate the input feed from the electrical storage element and magnetic field detection circuitry in the absence of an electrical current from the input feed.

In any embodiment, the electrical storage element may include a lead frame capacitor.

In an alternative embodiment, the configuration may provide a DC logic low level indicating the presence of an external magnetic field. The configuration may include a charge pump configured to increase the voltage of the electrical input feed current. In some cases, the increased voltage may be directed to an electrical storage element in order to minimize the size of the charge pump. In such an embodiment, the configuration may include a diode (e.g., resistor, transistor, or the like) positioned in the feedback connection to limit the logic low voltage level from falling below a practical level to be pumped. In such an embodiment, the logic high level remains indicative of the absence of an external magnetic source.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Overview

Figure 1:
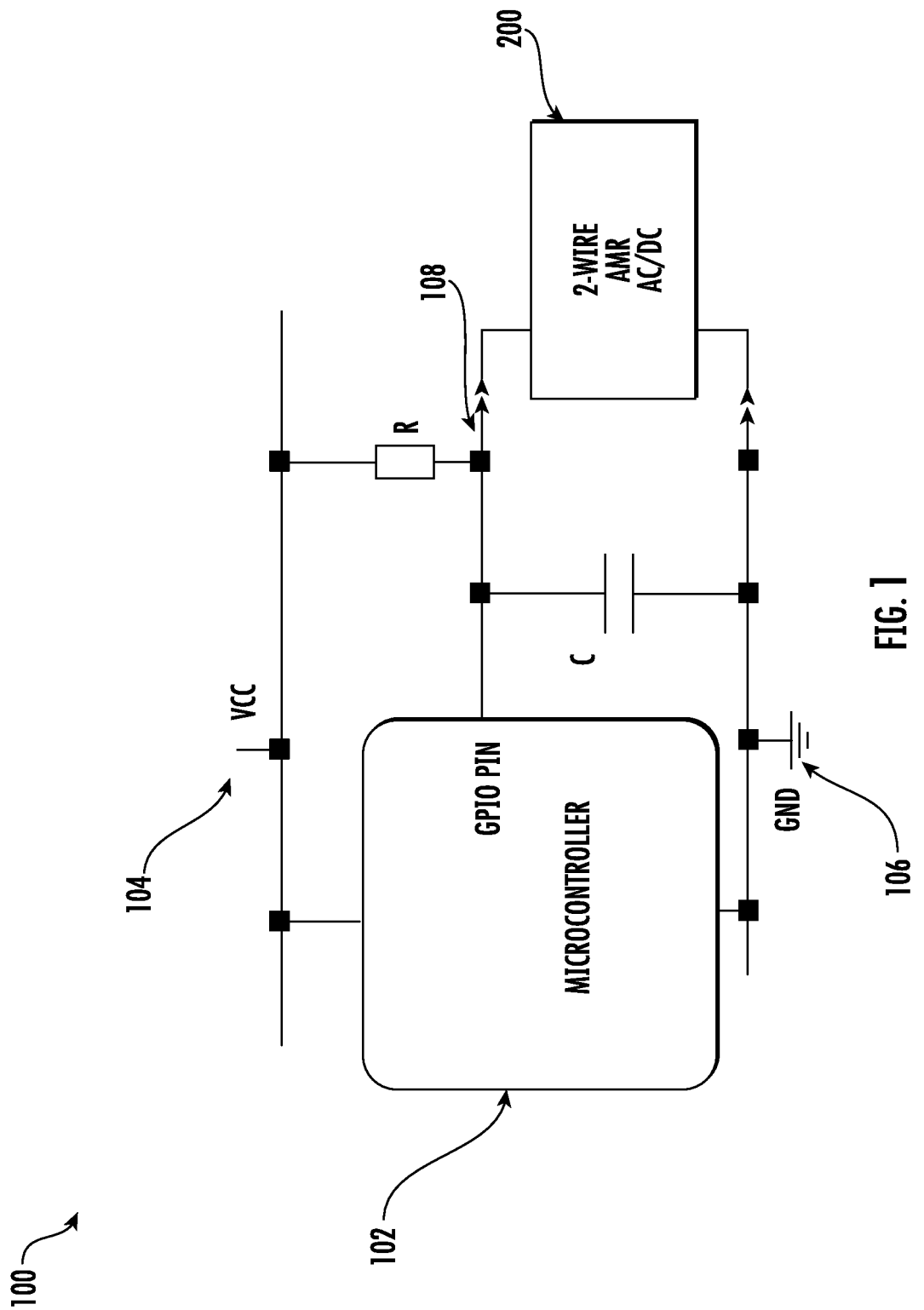
FIG. 1 is a schematic view of an active sensing system according to an example embodiment.

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As described above, various industries rely upon switches, contacts, and other applicable devices that are operable in response to applied magnetic fields. Traditionally, industrial applications, medical devices, consumer electronics, white goods, and the like relied upon reed switches in order to function as proximity sensors. These conventional reed switch applications operate by utilizing a sealed glass container or envelop that housed metal, flexible reeds or contacts. In some instances, these metal, flexible elements (e.g., reeds) were separated by an air gap indicating that the reed switch is open (e.g., electrical current flow therethrough is precluded). In the presence of an external magnetic field, however, the reeds may flex (e.g., due to the ferromagnetic nature of the elements) to contact one another and close the reed switch such that electrical current may flow therethrough. Once the external magnetic field is removed, however, the reeds may return to the open positon. Alternatively, the reeds may be initially in contact such that the reed switch is closed. In the presence of an external magnetic field, the reeds may open the switch such that electrical current therethrough is precluded.

As would be evident to one of ordinary skill in the art in light of the present disclosure, mechanical reed switches may be used as proximity sensors in a variety of applications. These mechanical elements, however, are often fragile and may, in some applications, be subjected to stress, strain, and/or the like such that the glass container may be compromised or the reeds may be damage. Furthermore, the mechanical movement of these physical elements over time may fatigue the reeds, and/or the contact between the reeds may induce wear on the sensor system. These issues may subsequently affect the reliability of the mechanical reed switch.

As such, solid state semiconductor based active sensors are emerging as replacements for mechanical reed sensors and provide improved cost, quality, and reliability over these mechanical counterparts. For example, Hall Effect sensors employ a current directed through a thin metal strip such that, in the presence of an applied magnetic field, the electrons in the metal strip move to produce a voltage gradient in the strip. This voltage gradient may be monitored such that the Hall Effect sensor may operate as a proximity sensor without moving mechanical elements. As described above and with reference to the embodiments herein, in an instance in which a magnetic field is present, the solid state semiconductor based active sensors may operate or conduct to allow current to pass therethrough and produce a logic low voltage level. While described with reference to a logic low level and logic high level, the present disclosure contemplates that the physical configuration of the solid state semiconductor based active sensor may be unchanged and that the open and closed positions for a typical reed switch instead refer to logic low or high voltage levels which may be generated through the ability for current to pass therethrough and the minimization of current flow, respectively. For magnetic sensors, the logic low level in the presence of a magnetic field is often described as the operated state and the logic high level in the absence of a magnetic field is often described as the released state. The disclosure appreciates that there is a practical limit to how much current can be minimized as the active semiconductor device requires some current to perform a sensing function. Although not entirely zero (as found in an ideal open switch or a higher than an open reed switch), the current may be small enough to be negligible for most applications.

Conventional attempts to employ these emerging solid state semiconductor based active sensors, however, require a three (3) wire configuration. In particular, traditional solid state semiconductor based active sensors require an input wire (e.g., a positive connection), a ground wire (e.g., a negative connection), and an output wire independent of the input wire and ground wire. In contrast, mechanical reed switches operate under direct current (DC) connections in which only two (2) wire configurations (e.g., an input wire and grounded wire) are employed. In these DC connections, the voltage across the sensor (e.g., reed switch) when the reed switch is closed is substantially zero (0) voltage as described hereinafter. Solid state semiconductors, however, cannot function for a period of zero voltage (e.g., no power in the components).

To address these issues and others, the magnetoresistive sensor configuration and associated active sensing systems of the present application are configured to maintain a minimum operating current and voltage within the magnetoresistive sensor in the presence of an external magnetic field that drives the voltage in the sensor either momentarily close to zero (0) volts in a periodic AC pattern or indefinitely at a potential above zero (0) volts but still low enough to be detected as a logic low level. As described hereafter, the magnetoresistive sensor configurations may employ an electrical storage element for storing electrical power, logic circuitry to generate an alternating current (AC) output, and isolation circuitry configured to isolate the zero voltage in the sensor from the solid state semiconductor elements such that the electrical storage element may maintain a minimum operating current and voltage within these elements. In some embodiments, a charge pump is used to internally boost the input level (e.g. slightly above zero) to a usable level. In this way, the devices of the present application may adapt solid state semiconductor based active sensors to two (2) wire DC connections.

Magnetoresistive Sensor Configurations

With reference to FIG. 1, an active sensing system 100 (e.g., sensing system 100) is illustrated. As shown, the sensing system 100 includes a microcontroller 102, a power source 104, a grounded connection 106, a general purpose input/output (GPIO) pin 108, and a magnetoresistive sensor 200. The power source 104 or voltage at common collector (VCC) refers to a connection between the sensing system 100 and a device configured to supply an electrical signal to the sensing system 100. By way of example, the power source 104 may include a positive connection with a battery, electrical wiring, or the like such that the power source 104 may direct electrical signals (e.g., supply power) to the sensor 104. In contrast, the grounded connection 106 may refer to the reference point in the electrical circuit of the sensing system 100. By way of continued example the grounded connection 106 may refer to the negative connection with a battery, electrical wiring, or the like. The sensing system 100 may further include additional resistors, capacitors, or other circuitry components based upon the intended application of the sensing system 100.

With continued reference to FIG. 1, the sensing system 100 may include a microcontroller 102 that may be configured to control operation of one or more elements of the sensing system 100. The microcontroller 102 may be embodied in any number of different ways and may, for example, include one or more processing devices configured to perform independently. Furthermore, the microcontroller 102 may be understood to include a single core processor, a multi-core processor, and/or the like. By way of example, the microcontroller 102 may be configured to execute instructions stored in a memory or otherwise accessible to one or more processors of the microcontroller 102. Alternatively or additionally, the microcontroller 102 may be configured to execute hard-coded functionality. As such, whether configured by hardware or by a combination of hardware with software, the microcontroller 102 may represent an entity (e.g., physically embodied in circuitry) capable of performing operations according to an embodiment of the present invention while configured accordingly.

Figure 2:
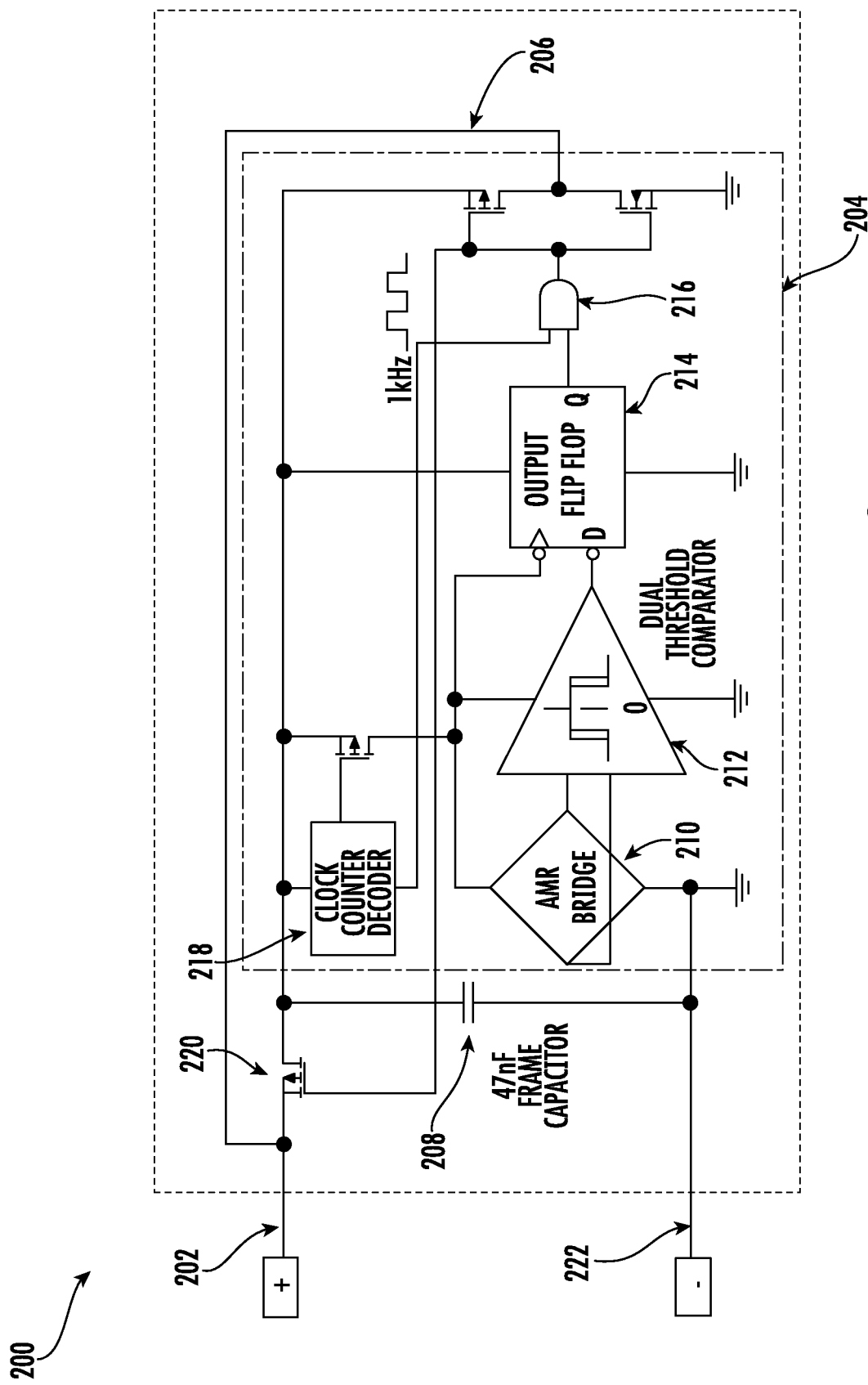
FIG. 2 is a schematic view of the magnetoresistive sensor configuration of FIG. 1 according to an example embodiment.

As described more fully hereafter with reference to FIG. 2, the sensing system 100 may include a magnetoresistive sensor 200 (e.g., sensor 200) configured to identify the presence of an external magnetic source. As shown in FIG. 1, the power source 104 may supply power to the sensing system 100 that may operate to power the microcontroller 102. In an instance in which the sensor 200 is in a logic high voltage state (e.g. low current and in the absence of an external magnetic source as described hereafter) the electrical signals provided by the power source 104 may be directed to the microcontroller 102 such that the microcontroller 102, via the GPIO pin 108, reads a voltage substantially equivalent to the voltage supplied by the power source 104 (e.g., release condition in FIG. 3). In an instance in which the sensor 200 is in a logic low voltage state (e.g., high current state in the presence of an external magnetic source as described hereafter) the electrical signals provided by the power source 104 may be directed through the sensor 200 to the grounded connection 106 such that the microcontroller 102, via the GPIO pin 108, momentarily reads a voltage substantially equivalent to zero (0) voltage (e.g., operate condition in FIG. 3). Said differently, in an instance in which the microcontroller 102 receives a voltage reading at the GPIO pin 108 (e.g., substantially equivalent to the VCC), the microcontroller 102 (and by extension the sensing system 100) may determine the absence of an external magnetic source. In an instance in which the microcontroller 102 receives a zero (0) voltage reading at the GPIO pin 108, the microcontroller 102 (and by extension the sensing system 100) may determine the presence of an external magnetic source.

With reference to FIG. 2, magnetoresistive sensor 200 (e.g., sensor 200) is illustrated. As shown, the sensor 200 may include an input feed 202, magnetic field detection circuitry 204, a feedback connection 206, and an electrical storage element 208. The input feed 202 may refer to an electrical connection configured to receive an electrical current or voltage. As described above with reference to FIG. 1, the power source 104 may supply electrical signals (e.g., supply power) to the sensing system 100. The power supplied by the power source 104 may be directed to the sensor 200 via the input feed 202. The sensor 200 may include a ground feed 222 in electrical communication with the grounded connection 106. The sensor 200 may further include magnetic field detection circuitry 204 in electrical communication with the input feed 202 and configured to identify the presence of an external magnetic source. As described above, the magnetic field detection circuitry 204 may, in the presence of an external magnetic source, be positioned in a closed position, and, in the absence of an external magnetic source, be positioned in an open position.

As illustrated in FIG. 2 and described above in the operation of FIG. 1, in an instance in which the magnetic field detection circuitry 204 is in the logic high level (e.g., open position, released state, or high impedance state) indicating the absence of an external magnetic source, the microcontroller 102 of FIG. 1 may read a voltage substantially equivalent to the VCC (e.g., current flow through the magnetic field detection circuitry 104 is precluded). In such an instance, the sensor 200 may be configured to direct at least a portion of the electrical current received via the input feed 202 to the electrical storage element 208 so as to store electrical energy in the electrical storage element 208. In some embodiments described hereafter, the sensor 200 may include isolation circuitry (e.g., P-type metal-oxide-semiconductor (PMOS) logic or any applicable switch) to facilitate direction of this electrical current. In some embodiments, the electrical storage element may comprise a lead frame capacitor or other equivalent electrical storage device.

With continued reference to FIG. 2, in an instance in which the magnetic field detection circuitry 204 is in the logic low state (e.g., closed position, operated state, or low impedance state) indicating the presence of an external magnetic source, the magnetic field detection circuitry 204 may be configured to direct at least a portion of the electrical current to the feedback connection 206. As described above with reference to three (3) wire solid state semiconductors, traditionally, an output wire is independent from the input feed 202. Said differently, a separate electrical connection is made at the output feed such that the output of the magnetic field detection circuitry 204 is not routed through the input feed 202. As shown in FIG. 2, however, the sensor 200 is configured such that the feedback connection 206 is in electrical communication with the input feed 202. When the magnetic field detection circuitry 204 is in the closed position, however, the power in the sensor 200 may be driven to zero (0) volts due to the grounded connection 106 of FIG. 1. The electrical storage element 208, however, is configured to maintain a minimum operating voltage and current within the magnetoresistive sensor 200 in an instance in which the magnetic field detection circuitry 204 drives to the logic low state (e.g. zero volts). As noted above, the electrical storage element 208 (e.g., lead frame capacitor) may store electrical energy while the magnetic field detection circuitry 204 is in the logic high state (or high impedance state). In conjunction with the isolation circuitry 220 configured to isolate the internal power (e.g., power of the sensor 200) and the external power drop (e.g., power supplied by the input feed 202), the electrical storage element 208 may ensure that electrical current and associated voltage is supplied to the sensor 200 to prevent malfunctions to the solid state semiconductor components of the magnetic field detection circuitry 204.

In some embodiments, the magnetic field detection circuitry 204 may further comprise an anisotropic magnetoresistive (AMR) bridge 210 (e.g., or hall sensor) configured to identify the presence of the external magnetic source. As would be evident to one of ordinary skill in the art in light of the present disclosure, the AMR bridge 210 may utilize magnetic thin films and/or thin magnetic metal strips configured to, in some instances, change resistance rate in response to an external magnetic source. This resistance rate change may further be indicative of a voltage difference in the AMR bridge 210. In such an embodiment, the magnetic field detection circuitry 204 may further include a dual threshold comparator 212 configured to receive a voltage output from the AMR bridge 210 and compare the voltage output with one or more voltage thresholds. As would be evident to one of ordinary skill in the art in light of the present disclosure, the dual threshold comparator 212 may operate to identify sufficient proximity of the external magnetic source (e.g., is the magnetic source close enough). Said differently, in instances in which the external magnetic source is not sufficiently near, the voltage output from the AMR bridge 210 may fail to exceed one or more voltage thresholds of the dual threshold comparator 212. Conversely, in instances in the external magnetic source is sufficiently near, the voltage output from the AMR bridge 210 may meet or exceed one or more voltage thresholds of the dual threshold comparator 212.

Figure 3:
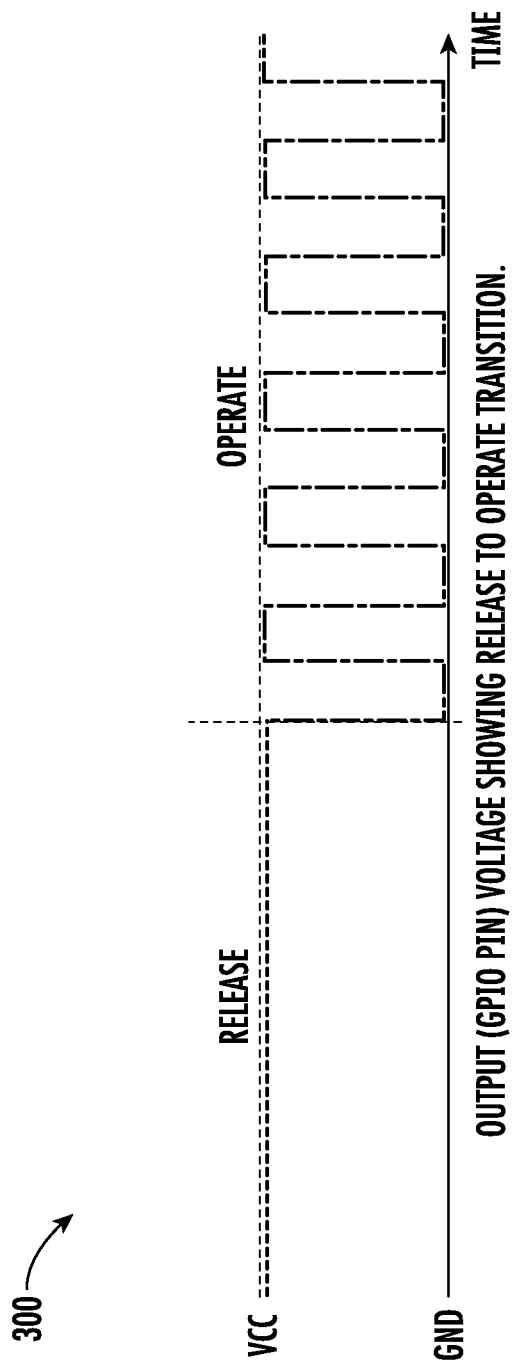
FIG. 3 is a plot of an output voltage illustrating a release (magnetic field absence) to operate (magnetic field presence) transition of the example embodiments of FIGS. 1-2.

In some embodiments, the magnetic field detection circuitry 204 further comprises output flip flop circuitry 214, logic circuitry 216, and/or clock counter decoder circuitry 218 configured to generate an alternating current (AC) output voltage from the AMR Bridge 210 and dual threshold comparator 212. As illustrated in FIG. 3 described hereafter, the clock counter decoder circuitry 218 may be configured to periodically direct electrical signals to the magnetic field detection circuitry 204. In this way, power consumption of the sensor 200 is minimized due to the intermittent transmission of electrical current from the input feed 202 to the solid state semiconductor components (e.g., magnetic detection circuitry 204) of the sensor 200. Said differently, the clock counter decoder circuitry 218 may periodically direct power to the sensor 200 in order to determine if an external magnetic source is present. This periodic application required to power analog circuitry may be independent from the periodic operated state that creates an AC digital waveform, for example a 1 kHz square wave, as shown in FIG. 3 which can run entirely in low power digital logic.

With reference to FIG. 3, a plot of an output voltage illustrating a release (e.g., de-activated or absence of a magnetic field) to operate (e.g., activated or in the presence of a magnetic field) transition of the example embodiments of FIGS. 1-2 is shown. As described above, the microcontroller 102 at the GPIO pin 108 may receive an AC square waveform 300 as shown in FIG. 3. As would be evident to one of ordinary skill in the art in light of the present disclosure, the release voltage may refer to an instance in which the sensor 200, in particular the magnetic field detection circuitry 204, is in a high impedance state (logic high) (e.g., negligible current may flow therethrough). As described above, the AC waveform 300 illustrates that the voltage received at the microcontroller 102 in these instance is substantially equivalent to the VCC. The AC waveform 300 further illustrates the periodic direction of electrical signals (e.g., current) to the magnetic detection circuitry 204 by the clock counter decoder circuitry 218 as instances during release in which the voltage reading by the microcontroller 102 at the GPIO pin 108 is substantially zero (e.g., at the grounded connection 106). As described above, in an instance in which the power in the sensor 200 drops to substantially zero or ground, the electrical storage element 208 may maintain a minimum operating current and voltage within the sensor 200.

As would be evident to one of ordinary skill in the art in light of the present disclosure, the AC waveform 300 may be received by the microcontroller 102. As such, in the sensor embodiment 100, the microcontroller may be configured to identify and rectify this AC waveform 300 to a direct current (DC) output or constant logic level for use by one or more elements in the sensing system 100 or other elements is communication with the sensing system 100.

Figure 4:
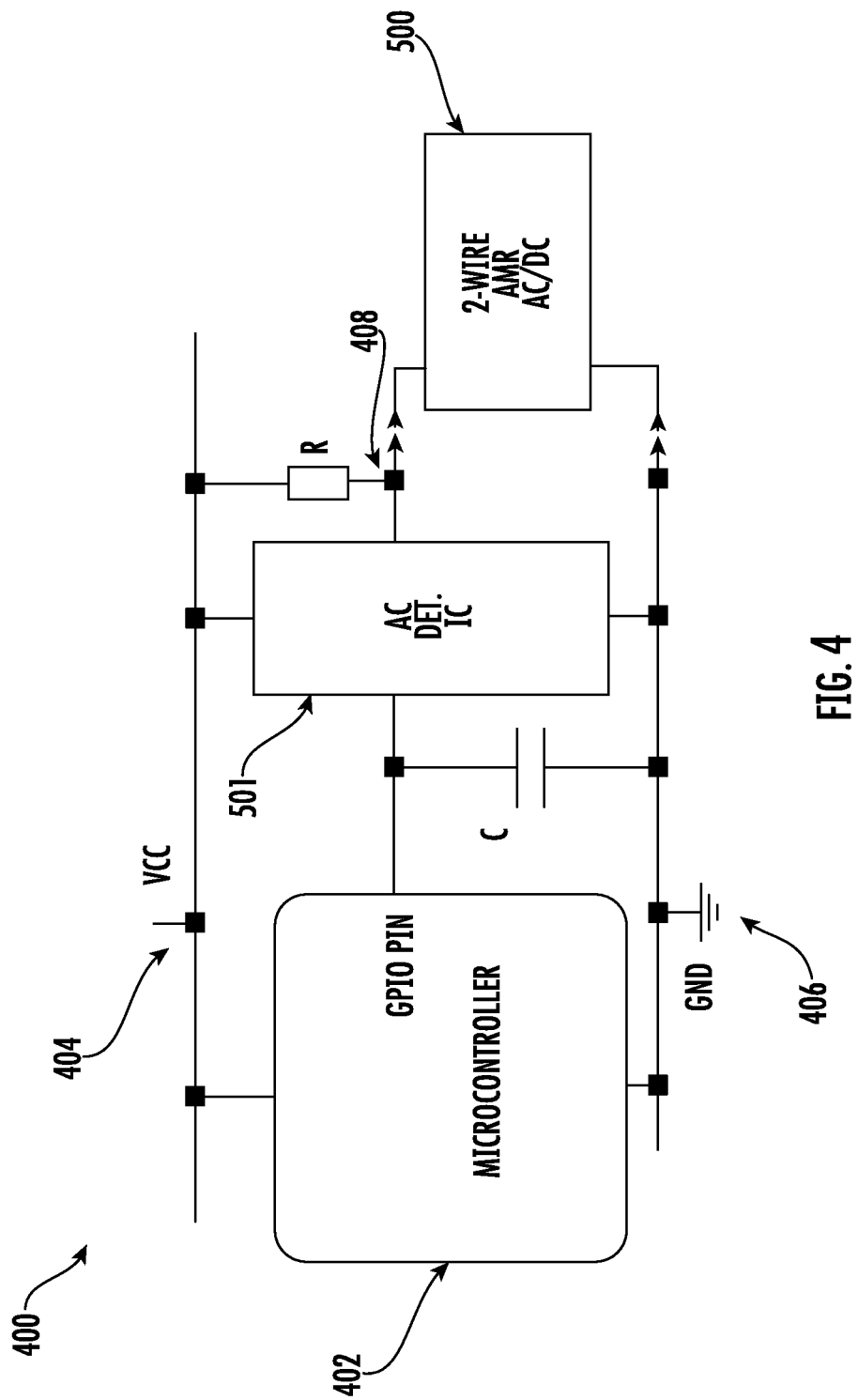
FIG. 4 is a schematic view of an active sensing system with alternating current (AC) voltage detection circuitry according to an example embodiment.
Figure 5:
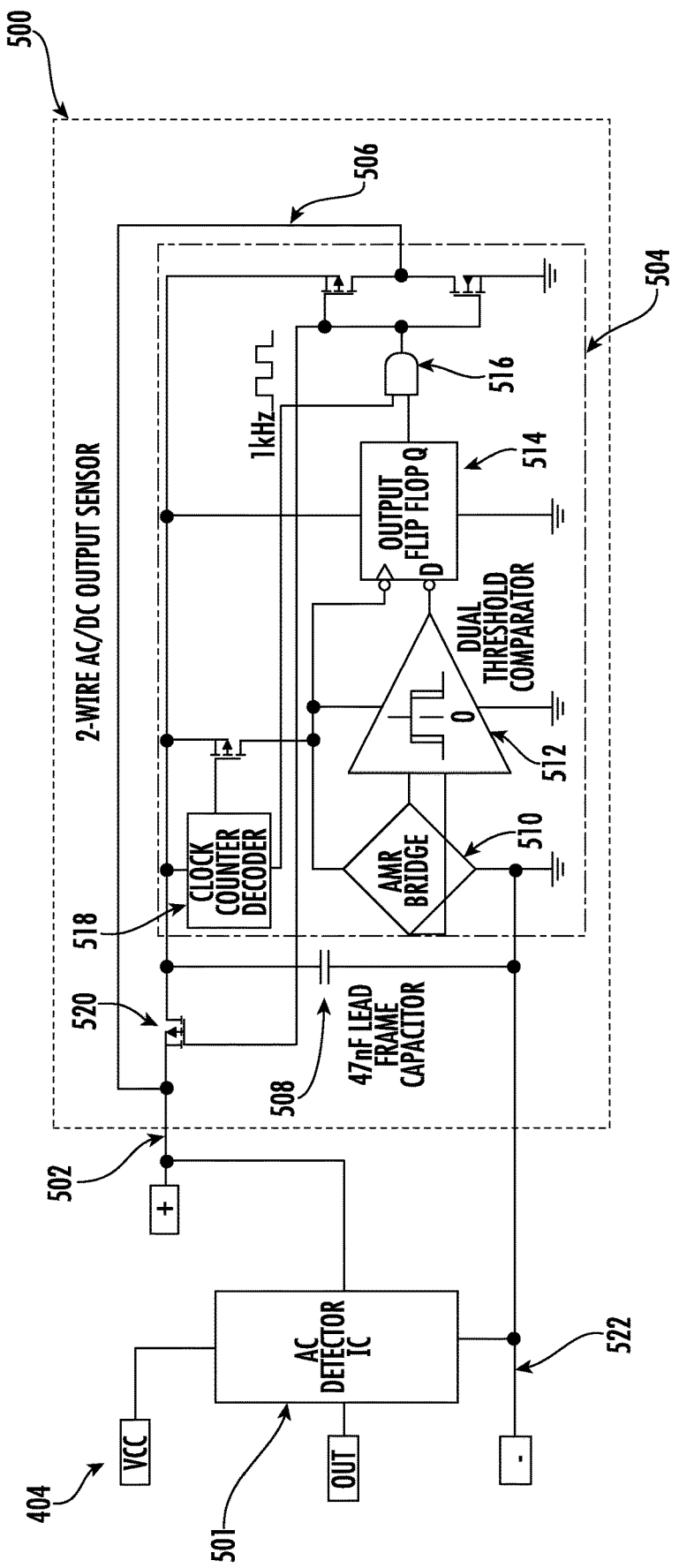
FIG. 5 is a schematic view of the magnetoresistive sensor configuration of FIG. 4 according to an example embodiment.

With reference to FIGS. 4-5, an active sensing system 400 (e.g., system 400) with alternating current (AC) detection circuitry 501 is illustrated. As noted above with reference to the embodiments of FIGS. 1-3, the output from the sensor 200 (e.g., as well as sensor 500 described hereafter) may be in an AC waveform (e.g., AC waveform 300). In the embodiments of FIGS. 4-5, however, the system 400 may further include an alternating current (AC) waveform detector integrated circuit 501 configured to generate a direct current (DC) output from the AC output. As shown in FIG. 5, the system 400 may include substantially the same elements as sensing system 100. In particular, the system 400 may include a microcontroller 402, a power source 404, a grounded connection 406, a general purpose input/output (GPIO) pin 408, a magnetoresistive sensor 500, and an AC waveform detector integrated circuitry 501.

With reference to FIG. 5, the magnetoresistive sensor configuration 500 (e.g., sensor 500) and an AC waveform detector integrated circuitry 501 are illustrated. As noted above, the sensor 500 may include substantially the same elements as sensor 200 described above with reference to FIGS. 1-2. In particular, the sensor 500 may include an input feed 502, magnetic field detection circuitry 504, a feedback connection 506, an electrical storage element 508, and a ground feed 522. As described above, the magnetic field detection circuitry 504 may include an AMR bridge 510, a dual threshold comparator 512, an output flip flop circuitry 514, logic circuitry 516, clock counter decoder circuitry 518, and/or isolation circuitry 520. Each of these elements may be configured to operate substantially equivalent to the corresponding elements of sensor 200.

Figure 6:
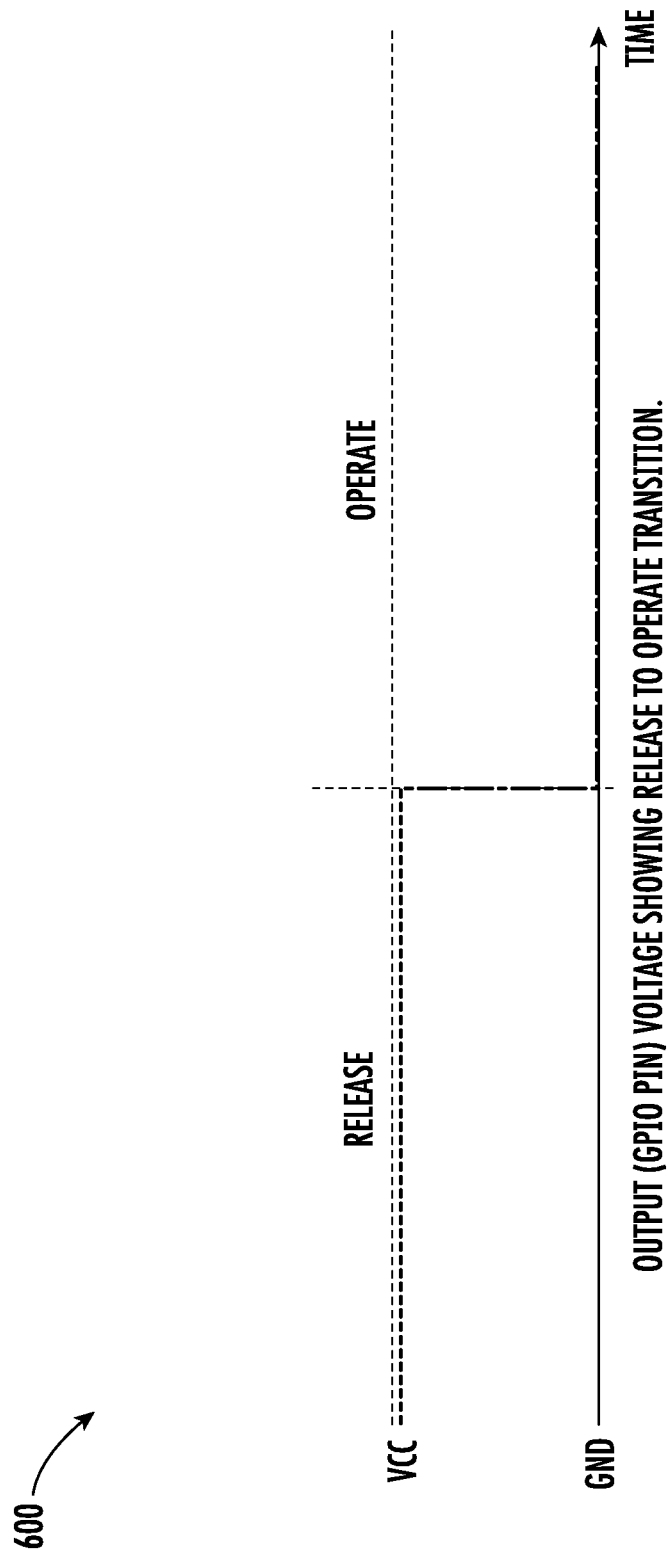
FIG. 6 is a plot of an output voltage illustrating a release (magnetic field absence) to operate (magnetic field presence) transition of the example embodiments of FIGS. 4-5.

With reference to FIG. 6, however, a plot of an output voltage illustrating a release to operate transition of the example embodiments of FIGS. 4-5 is shown. Unlike the AC waveform 300 of FIG. 3, the transition plot 600 of FIG. 6 illustrates the effect of the AC waveform detector integrated circuitry 501. Unlike the embodiment of FIGS. 1-3 in which the microcontroller 102 at the GPIO pin 108 may receive an AC square waveform 300 as shown in FIG. 3, this AC waveform may be received at the AC waveform detector integrated circuit 501 as opposed to the microcontroller 402. As would be evident to one of ordinary skill in the art in light of the present disclosure, the AC waveform detector integrated circuit 501 may perform substantially the same operations required of the microcontroller 102 in FIGS. 1-2. Said differently, the AC waveform detector integrated circuit 501 may be configured to identify and rectify an AC waveform from the sensor 500 to a direct current (DC) output for transmission to the microcontroller 402. In this way, the sensor 500 may be configured for use with microcontrollers 402 incapable of rectifying AC waveforms.

Figure 7:
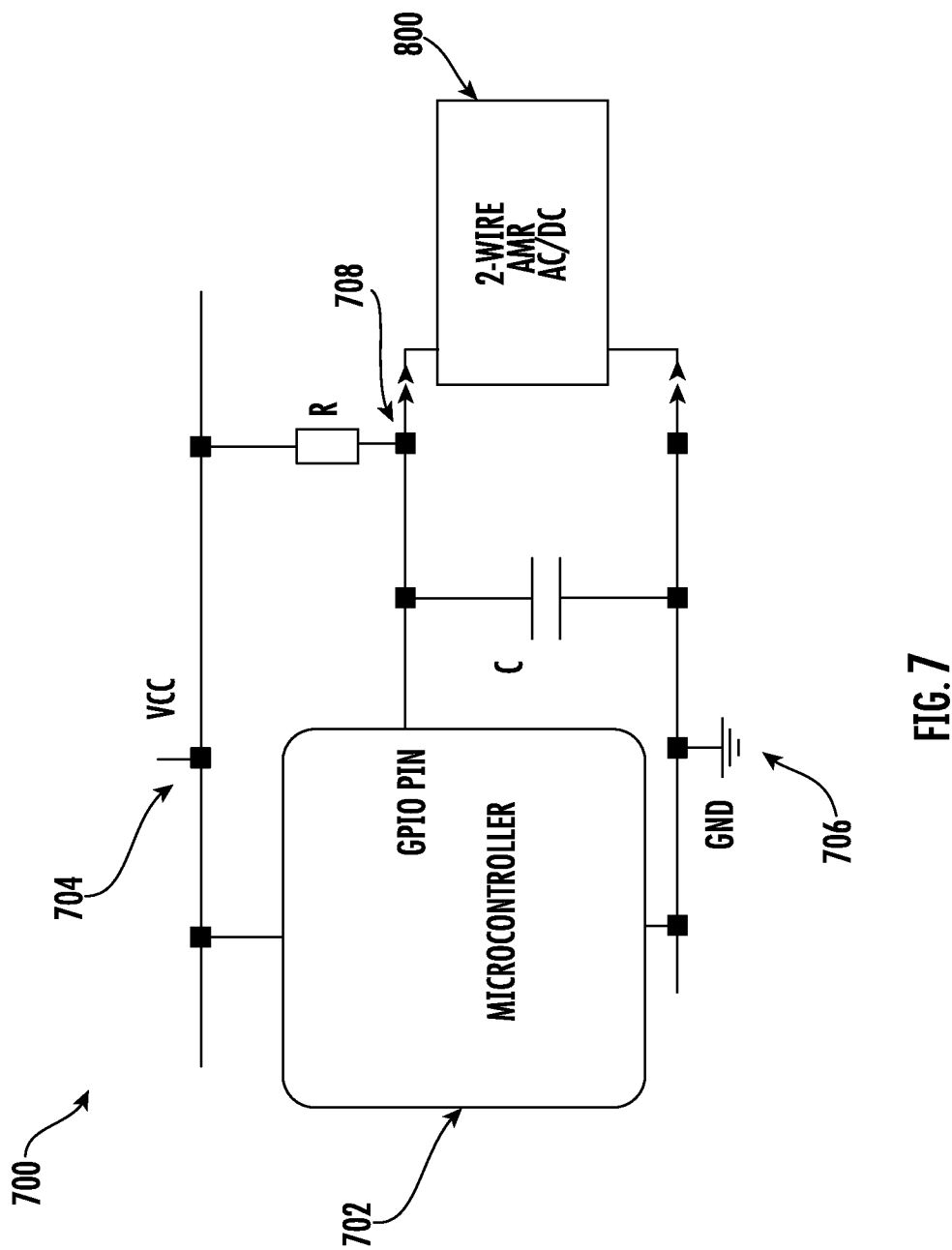
FIG. 7 is a schematic view of an active sensing system with charge pump according to an example embodiment.
Figure 8:
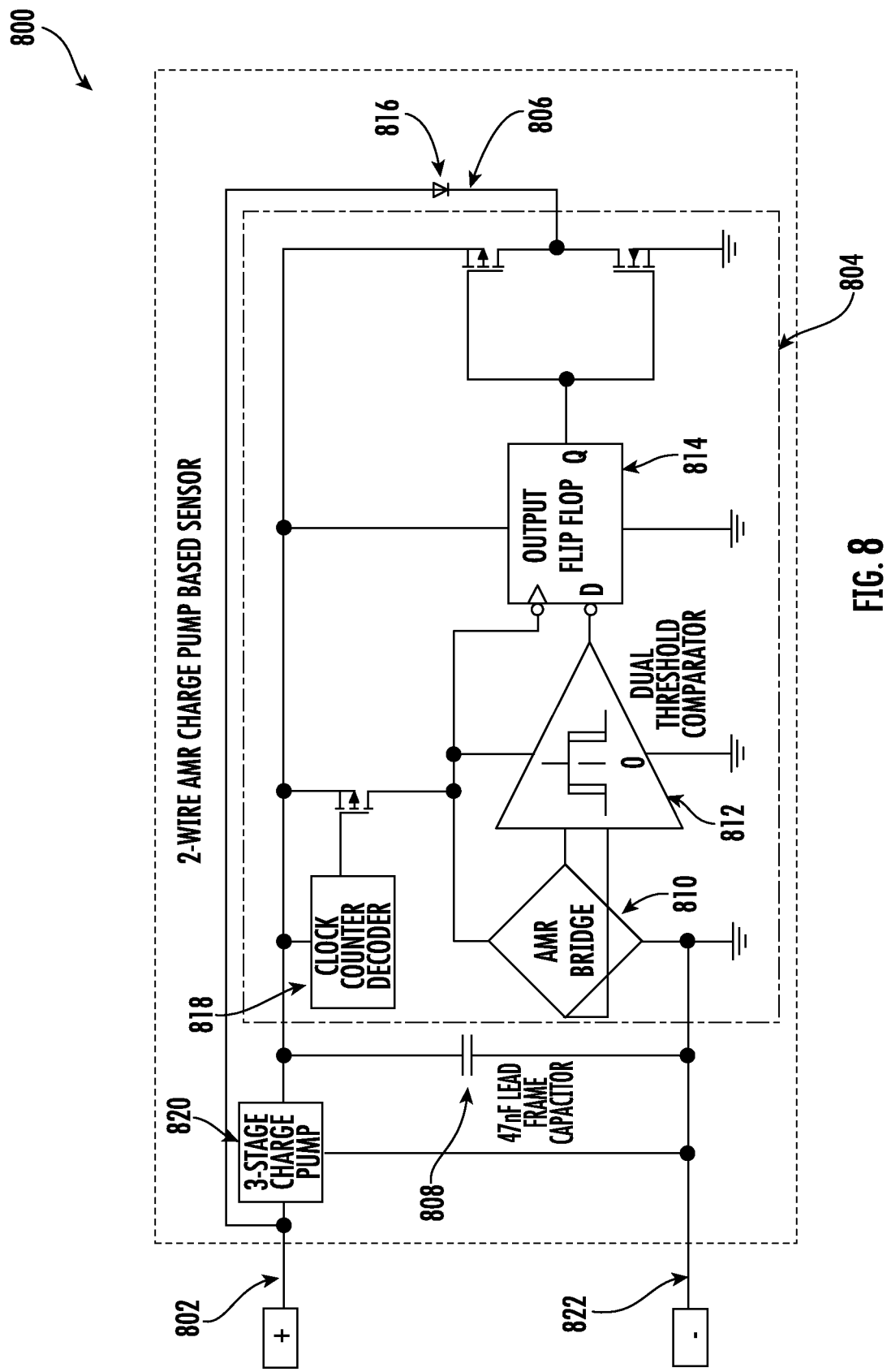
FIG. 8 is a schematic view of the magnetoresistive sensor configuration of FIG. 7 according to an example embodiment.

With reference to FIGS. 7-8, a sensing system 700 (e.g., system 700) with charge pump is illustrated. As shown in FIG. 7, the system 700 may include substantially the same elements as sensors 100 and 400. In particular, the system 700 may include a microcontroller 702, a power source 704, a grounded connection 706, a general purpose input/output (GPIO) pin 708, and a magnetoresistive sensor 800.

With reference to FIG. 8, a magnetoresistive sensor 800 (e.g., sensor 800) is illustrated. As shown, the sensor 800 may include an input feed 802, magnetic field detection circuitry 804, a feedback connection 806, an electrical storage element 808, a charge pump 820, a ground feed 822, and a diode 816. The input feed 802, ground feed 822, and feedback connection 806, may operate substantially the same as the corresponding elements of the embodiments of FIGS. 1-2 and FIGS. 4-5. Additionally, the magnetic field detection circuitry 804 may include an AMR bridge 810, dual threshold comparator 812, output flip flop circuitry 814 and clock counter decoder circuitry 818 that operates substantially the same as the embodiments above.

With continued reference to FIG. 8, the sensor 800, however, does not include logic circuitry and/or isolation circuitry. Instead, the sensor 800 includes a diode 816 positioned in the feedback connection 806. As would be evident to one of ordinary skill in the art in light of the present disclosure, the diode 816 may operate to allow the voltage in the sensor 800 to pull low while limiting the voltage from dropping too low so as to result in the malfunction in the solid state semiconductor devices of the sensor 800. Furthermore, the sensor 800 includes a charge pump 820 to boost the voltage in the sensor 800. As would be evident to one of ordinary skill in the art, the charge pump 820 may be configured to receive electrical signals having a voltage that is less than the minimum operating voltage or current for the sensor 800. In some instances, the charge pump 820 may increase the voltage of the electrical signal and direct these increased voltages to the electrical charging element 808 so as to minimize the requirements of the charge pump. Furthermore, the charge pump 820 in conjunction with the diode 816 may be configured to set the minimum operating current and voltage within the sensor 800 as described hereafter with reference to FIG. 9.

Figure 9:
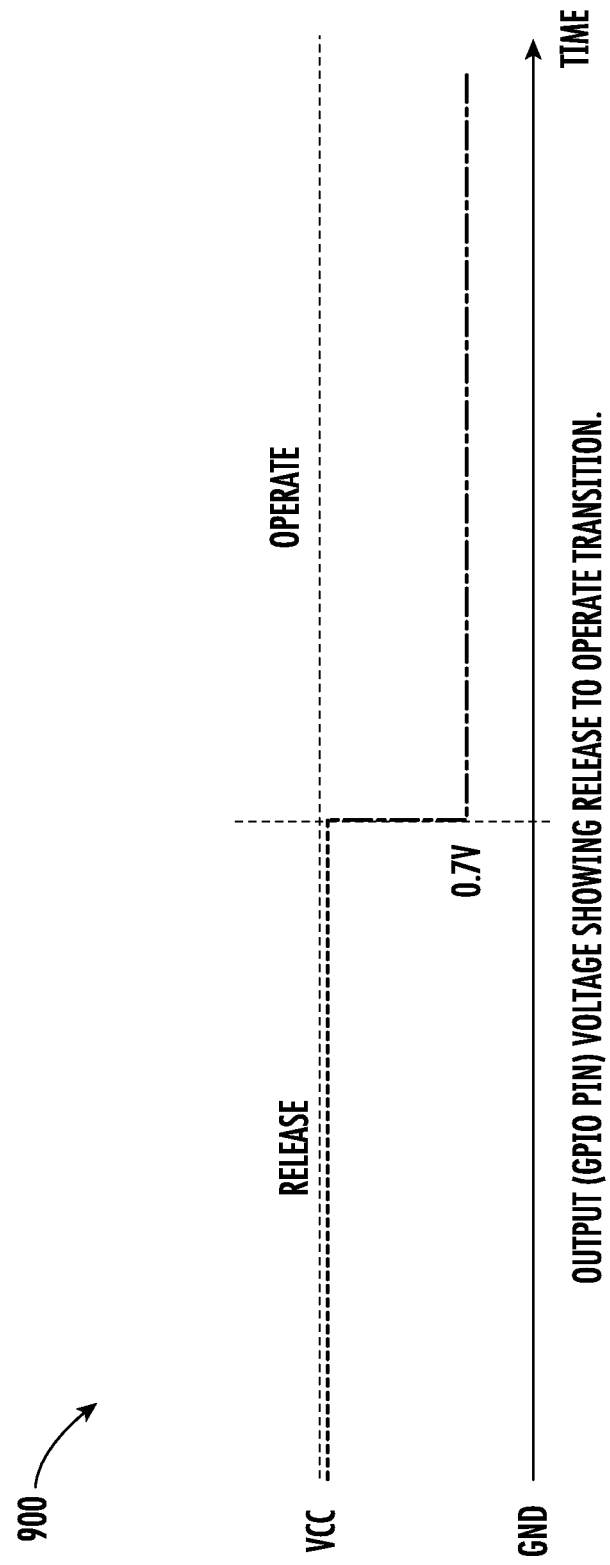
FIG. 9 is a plot of an output voltage illustrating a release (magnetic field absence) to operate (magnetic field presence) transition of the example embodiments of FIGS. 7-8.

With reference to FIG. 9, a plot of an output voltage illustrating a release to operate transition of the example embodiments of FIGS. 7-8 is shown. Unlike the AC waveform noted above, the microcontroller 702 at the GPIO pin 708 may receive a constant voltage 900 gated at the minimum operating voltage (for example 0.7 volts) as shown in FIG. 9. As would be evident to one of ordinary skill in the art in light of the present disclosure, the release voltage may refer to instance in which the sensor 800, in particular the magnetic field detection circuitry 804, is in an open positon (e.g., negligible current may flow therethrough). As described above, the charge pump 820 and the diode 816 may function to maintain a minimum current and voltage in the sensor 800. Said differently, in instances during the operated state (e.g., logic low level or closed) in which the voltage reading by the microcontroller 802 at the GPIO pin 808 would typically drop to substantially zero (e.g., at the grounded connection 806), the charge pump 820 and electrical storage element 808 may maintain a minimum operating current and voltage within the sensor 800.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A magnetoresistive sensor configuration comprising:
an input feed configured to receive an electrical current;
magnetic field detection circuitry in electrical communication with the input feed, wherein the magnetic field detection circuitry is configured to, in the presence of an external magnetic source, drive to a logic low state, and, in the absence of an external magnetic source, drive to a logic high state;
a feedback connection in electrical communication with the magnetic field detection circuitry and the input feed; and
an electrical storage element in electrical communication with the input feed,
wherein, in an instance in which the magnetic field detection circuitry is in the logic high state indicating the absence of an external magnetic source, the magnetoresistive sensor configuration is configured to direct at least a portion of the electrical current received via the input feed to the electrical storage element so as to store electrical energy in the electrical storage element,
wherein, in an instance in which the magnetic field detection circuitry is in the logic low state indicating the presence of an external magnetic source, the magnetic field detection circuitry is configured to direct at least a portion of the electrical current to the feedback connection and the electrical storage element is configured to maintain a minimum operating voltage and current within the magnetoresistive sensor.

2. The magnetoresistive sensor configuration according to claim 1, further comprising isolation circuitry configured to isolate the input feed from the electrical storage element and magnetic field detection circuitry in the absence of an electrical current from the input feed.

3. The magnetoresistive sensor configuration according to claim 1, wherein the magnetic field detection circuitry further comprises an anisotropic magneto-resistive (AMR) bridge or hall sensor configured to identify the presence of the external magnetic source.

4. The magnetoresistive sensor configuration according to claim 3, wherein the magnetic field detection circuitry further comprises a dual threshold comparator configured to receive a voltage output from the AMR bridge or hall sensor and compare the voltage output with one or more voltage thresholds.

5. The magnetoresistive sensor configuration according to claim 1, wherein the magnetic field detection circuitry further comprises logic circuitry configured to generate an alternating current (AC) voltage output.

6. The magnetoresistive sensor configuration according to claim 1, wherein the magnetic field detection circuitry further comprises clock counter decoder circuitry configured to periodically direct electrical signals to the magnetic field detection circuitry.

7. The magnetoresistive sensor configuration according to claim 5, further comprising an alternating current (AC) waveform detector integrated circuit configured to generate a direct current (DC) voltage output from the AC voltage output.

8. The magnetoresistive sensor configuration according to claim 1, wherein the electrical storage element comprises a lead frame capacitor.

9. An active sensing system comprising:
a power source configured to supply an electrical current;
a grounded connection;
a microcontroller in electrical communication with the power source and the grounded connection; and
a magnetoresistive sensor configuration in electrical communication with the power source, the grounded connection, and the microcontroller, the magnetoresistive sensor configuration comprising:
an input feed configured to receive an electrical current supplied by the power source;
magnetic field detection circuitry in electrical communication with the input feed, wherein the magnetic field detection circuitry is configured to, in the presence of an external magnetic source, drive to a logic low state, and, in the absence of an external magnetic source, drive to a logic high state;
a feedback connection in electrical communication with the magnetic field detection circuitry and the input feed; and
an electrical storage element in electrical communication with the input feed,
wherein, in an instance in which the magnetic field detection circuitry is in the logic high state indicating the absence of an external magnetic source, the magnetoresistive sensor configuration is configured to direct at least a portion of the electrical current received via the input feed to the electrical storage element so as to store electrical energy in the electrical storage element,
wherein, in an instance in which the magnetic field detection circuitry is in the logic low state indicating the presence of an external magnetic source, the magnetic field detection circuitry is configured to direct at least a portion of the electrical current through the feedback connection to the grounded connection and the electrical storage element is configured to maintain a minimum operating voltage and current within the magnetoresistive sensor.

10. The active sensing system according to claim 9, further comprising isolation circuitry configured to isolate the input feed from the electrical storage element and magnetic field detection circuitry in the absence of an electrical current from the input feed.

11. The active sensing system according to claim 9, wherein the magnetic field detection circuitry further comprises an anisotropic magneto-resistive (AMR) bridge or hall sensor configured to identify the presence of the external magnetic source.

12. The active sensing system according to claim 11, wherein the magnetic field detection circuitry further comprises a dual threshold comparator configured to receive a voltage output from the AMR bridge or hall sensor and compare the voltage output with one or more voltage thresholds.

13. The active sensing system according to claim 9, wherein the magnetic field detection circuitry further comprises logic circuitry configured to generate an alternating current (AC) voltage output.

14. The active sensing system according to claim 9, wherein the magnetic field detection circuitry further comprises clock counter decoder circuitry configured to periodically direct electrical signals to the magnetic field detection circuitry.

15. The active sensing system according to claim 13, further comprising an alternating current (AC) waveform detector integrated circuit configured to generate a direct current (DC) voltage from the AC voltage output.

16. The active sensing system according to claim 9, wherein the electrical storage element comprises a lead frame capacitor.

* * * * *